United States Patent
Neti et al.

(10) Patent No.: US 9,541,606 B2
(45) Date of Patent: Jan. 10, 2017

(54) FAULT DETECTION SYSTEM AND ASSOCIATED METHOD

(71) Applicant: General Electric Company, Schenectady, NY (US)

(72) Inventors: Prabhakar Neti, Rexford, NY (US); Pinjia Zhang, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 304 days.

(21) Appl. No.: 13/716,969

(22) Filed: Dec. 17, 2012

(65) Prior Publication Data

US 2014/0167810 A1    Jun. 19, 2014

(51) Int. Cl.
*G01R 31/34* (2006.01)
*G01M 13/04* (2006.01)

(52) U.S. Cl.
CPC ............ *G01R 31/34* (2013.01); *G01M 13/045* (2013.01); *G01R 31/343* (2013.01)

(58) Field of Classification Search
None
See application file for complete search history.

(56) References Cited

U.S. PATENT DOCUMENTS

| | | | |
|---|---|---|---|
| 4,261,206 A * | 4/1981 | Futakawa | G01R 31/346 73/579 |
| 4,542,649 A * | 9/1985 | Charbonneau | G07C 3/00 137/552 |
| 4,965,513 A | 10/1990 | Haynes et al. | |
| 5,995,910 A | 11/1999 | Discenzo | |
| 6,065,332 A | 5/2000 | Dominick | |
| 6,338,029 B1 | 1/2002 | Abbata et al. | |
| 6,469,504 B1 * | 10/2002 | Kliman | G01N 27/9006 324/228 |
| 2005/0200378 A1 | 9/2005 | Hobelsberger et al. | |
| 2006/0071666 A1 | 4/2006 | Unsworth et al. | |
| 2008/0065281 A1 * | 3/2008 | Tran | G01H 1/00 701/3 |
| 2008/0144927 A1 | 6/2008 | Hashimoto et al. | |
| 2010/0211334 A1 | 8/2010 | Sheikman et al. | |
| 2011/0018727 A1 | 1/2011 | Bharadwaj et al. | |

(Continued)

FOREIGN PATENT DOCUMENTS

WO    2011006528 A1    1/2011

OTHER PUBLICATIONS

"A Rapid Helicopter Drive Train Failt Detection Using Neuro-Fuzzy Method" by Tran et al. (3 pages) 2008.*

(Continued)

*Primary Examiner* — Paresh Patel
(74) *Attorney, Agent, or Firm* — John P. Darling

(57) ABSTRACT

A method implemented using a controller based device includes receiving a measured electrical signal from an electrical device of an electromechanical device and receiving a measured vibration signal from a mechanical device of the electromechanical device, coupled to the electrical device. The method further includes determining a first signal signature based on the measured electrical signal and determining a second signal signature based on the measured vibration signal. The method also includes determining a diagnostic parameter based on the first signal signature and the second signal signature and determining a fault in the mechanical device based on the diagnostic parameter.

16 Claims, 5 Drawing Sheets

(56) References Cited

U.S. PATENT DOCUMENTS

2014/0167810 A1* 6/2014 Neti et al. ............... 324/765.01

OTHER PUBLICATIONS

European search report issued in connection with EP Application No. 13196542.8, Mar. 14, 2014.

"Condition Monitoring Service Offers Early-Warning Against Large Motor Failure", Downloaded from internet<http://www.abb.co.in/cawp/seitp202/091dbb6527e406aec125784f004891da.aspx> on Dec. 26, 2012, ABB News Release UK, Mar. 10, 2011, 1 Page.

* cited by examiner

FAULT DETECTION SYSTEM AND ASSOCIATED METHOD

BACKGROUND

The technology disclosed herein, generally relates to fault detection of electromechanical machines (EMM). More specifically, the subject matter relate to detection of faults in various components of a drivetrain in an electromechanical machine.

Electromechanical machines having electrical generators, motors and a drive train may generate torsional and radial vibrations due to presence of defective components such as bearings, gears, or the like. Conventionally, vibration analysis of electro mechanical machines may be performed to monitor operating conditions of the machine. Mechanical faults in electromechanical systems having a drive train may generate vibrations at the rotor rotating frequency. Analysis of rotor rotating frequency facilitates to detect mechanical faults associated with the drive train. Vibration signals may be used to effectively monitor radial vibrations. But, it has been found that vibration signals cannot detect all types of faults associated with the various components of the drive train.

Further, torsional vibrations generated by the defective drive-train components that are physically present outside of the machine may not be captured. Although, certain conventional techniques are available for determining faults in gears of the drivetrain, a bearing fault in the gearbox is not effectively determined by conventional techniques.

Therefore, there exists a need for an improved method and system for monitoring a fault condition of a mechanical device in an EMM.

BRIEF DESCRIPTION

In accordance with one exemplary embodiment, a method of detecting faults in a mechanical device of an electromechanical device is disclosed. The method includes receiving a measured electrical signal from an electrical device of an electromechanical device and receiving a measured vibration signal from a mechanical device of the electromechanical device, coupled to the electrical device. The method further includes determining a first signal signature based on the measured electrical signal and determining a second signal signature based on the measured vibration signal. The method also includes determining a diagnostic parameter based on the first signal signature and the second signal signature and determining a fault in the mechanical device based on the diagnostic parameter.

In accordance with another exemplary embodiment, a system for detecting faults in a mechanical device of an electromechanical machine is disclosed. The system includes a controller based device configured to receive a measured electrical signal from an electrical device of an electromechanical device and to receive a measured vibration signal from a mechanical device of the electromechanical device, coupled to the electrical device. The controller based device is further configured to determine a first signal signature based on the measured electrical signal and to determine a second signal signature based on the measured vibration signal. The controller based device is also configured to determine a diagnostic parameter based on the first signal signature and the second signal signature and to determine a fault of the drivetrain based on the diagnostic parameter.

In accordance with another exemplary embodiment, a non-transitory computer readable medium encoded with a program to instruct a controller based device is disclosed. The program instructs the controller based device to receive a measured electrical signal from an electrical device of an electromechanical device and to receive a measured vibration signal from a mechanical device of the electromechanical device, coupled to the electrical device. The program further instructs the controller based device to determine a first signal signature based on the measured electrical signal and to determine a second signal signature based on the measured vibration signal. The program also instructs the controller based device to determine a diagnostic parameter based on the first signal signature and the second signal signature and to determine a fault of the mechanical device based on the diagnostic parameter.

DRAWINGS

These and other features and aspects of embodiments of the present technology will become better understood when the following detailed description is read with reference to the accompanying drawings in which like characters represent like parts throughout the drawings, wherein.

DETAILED DESCRIPTION

Embodiments of the present technology relate to a system and method for detecting faults in a mechanical device of an EMM. A measured electrical signal is received from an electrical device of an EMM. Further, a measured vibration signal is received from the mechanical device of the EMM, coupled to the electrical device. A first signal signature is determined based on the measured electrical signal and a second signal signature is determined based on the measured vibration signal. One or more diagnostic parameters are determined based on the first signal signature and the second signal signature. One or more faults of the mechanical device are determined based on the determined one or more diagnostic parameters.

Figure 1:
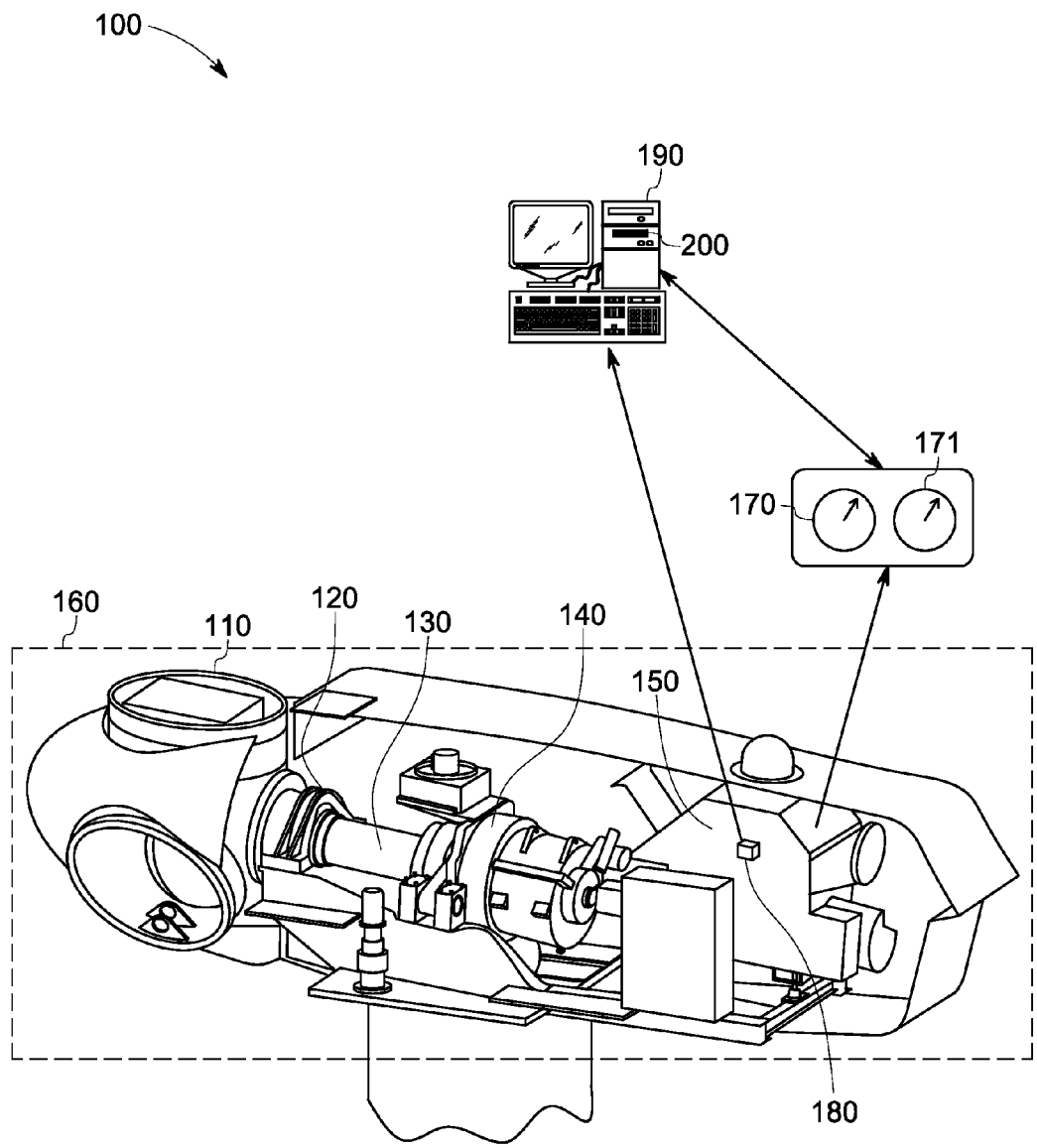
FIG. 1 is a diagrammatic illustration of a system having a fault detection system in accordance with an exemplary embodiment.

FIG. 1 is a diagrammatic illustration of a system 100 in accordance with an exemplary embodiment of the present invention. The system 100 includes an EMM 160 having at least one electrical device 150 and a mechanical device 140. The system 100 further includes two electrical sensors 170, at least one vibration sensor 180 to measure electrical signals and vibration signals from the EMM 160. The number of electrical sensors and the vibration sensors may vary depending on the application. In one embodiment, only one electrical signal and a vibration signal may be measured. The system 100 further includes a controller based device 190 for receiving both electrical signals and the vibration signals measured by the electrical sensors 170, 171 and the vibration sensor 180. The EMM 160 also includes a rotor assembly 110, a main bearing 120, and a main shaft 130. In the illustrated embodiment, the electrical device 150 is a generator for generating output power 208, and the mechanical device 140 is a drive train. It should be noted herein that the electrical device 150 may be referred to as a motor and the mechanical device 140 may be referred to as a gearbox/drive train interchangeably. In other embodiments, other types of electrical and mechanical devices are envisioned.

In the illustrated embodiment, the electrical sensor 170 is a current sensor for sensing current and the other electrical sensor 171 is a voltage sensor for sensing voltage of the generator 150. The electrical sensors 170, 171 may be referred to as current sensor and voltage sensor interchangeably. In one embodiment, the current sensor 170 measures current flowing through one or more phases of the generator 150. Similarly, the voltage sensor 171 may measure voltage across one or more phases of the generator 150. While certain embodiments of the present technology may be discussed with respect to a multi-phase generator, it should be noted herein that in other embodiments of the present technology other types of multi-phase EMM may be envisioned. The vibration sensor 180 is used to detect vibrations of at least one of the generator 150, the drive train 140, and other devices of the electromechanical device 160. The vibrations may include at least one of stator vibrations, rotor vibrations, and bearing vibrations. The vibration sensor 180 may be an accelerometer, a displacement transducer or a velocity transducer. Other types of vibration sensors and/or electrical sensors may also be envisioned within the scope of the present technology. The controller based device 190 receives signals from the vibration sensor 180 and the electrical sensors 170, 171. The controller based device 190 may be a general purpose computer, or a Digital Signal Processor (DSP), or a controller. The controller based device 190 may include an input device (not shown) such as a keyboard, a mouse, and a controller for receiving additional information from a user to configure the controller based device 190 to perform various computational operations associated with the present invention. The controller based device 190 may include a memory 200 which may be a random access memory (RAM), read only memory (ROM), or any other form of computer readable memory accessible by the controller based device 190. The memory 200 may be encoded with a program to instruct the controller based device 190 to enable a sequence of steps to determine a fault of the drivetrain 140. The controller based device 190 may also be suitably configured to monitor and detect fault conditions of various components, for example, the bearing faults of the drivetrain 140, within the EMM 160.

Figure 2:
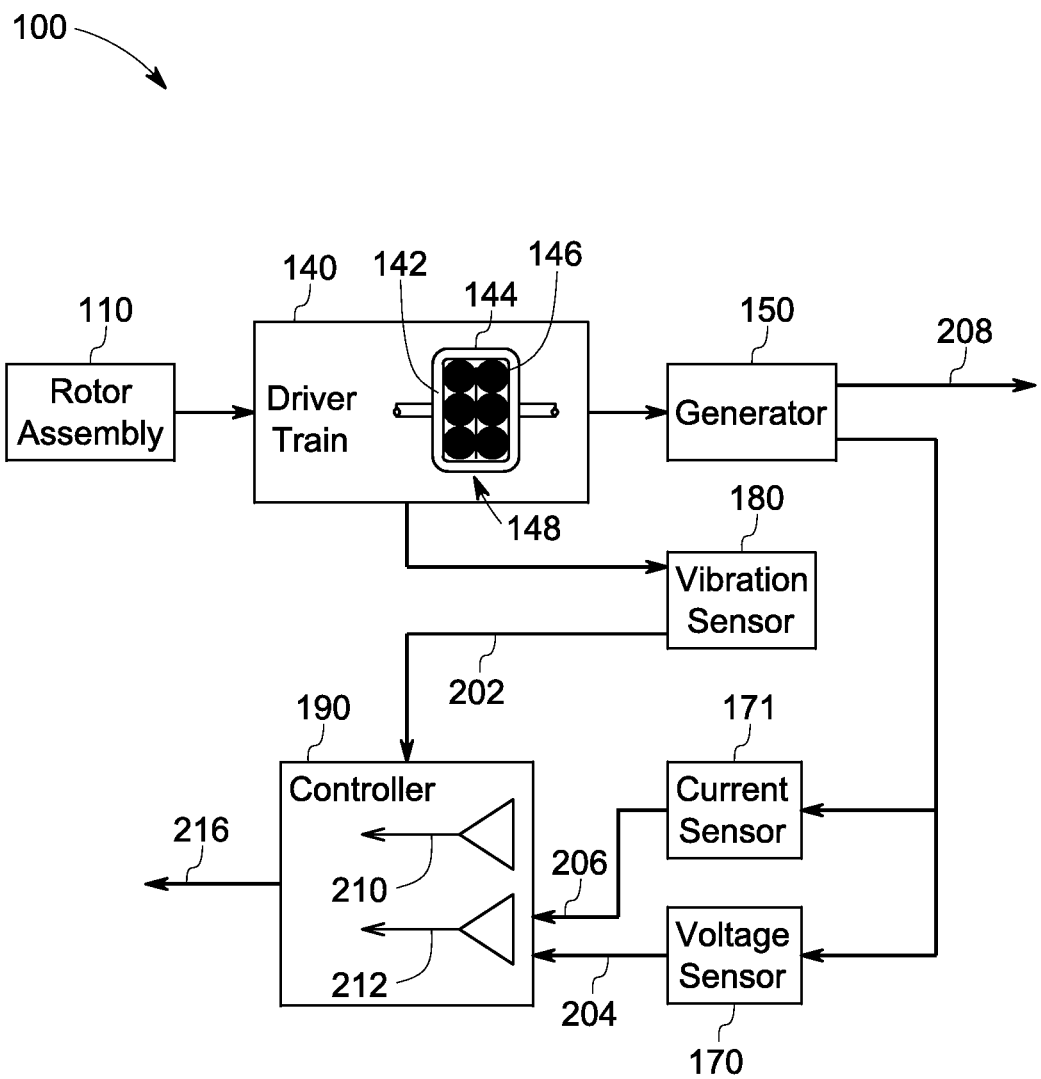
FIG. 2 is a block diagram of a fault detection system in accordance with an exemplary embodiment.

FIG. 2 is a block diagram system 100 in accordance with an exemplary embodiment. As discussed with reference to FIG. 1, the rotor assembly 110 is coupled to the generator 150 via the drive train 140. Electrical signals 204, 206 measured by the electrical sensors 170, 171, and vibration signals 202 measured by the vibration sensors 180 are received by the controller based device 190 to generate a vibration signal signature 210 and an electrical signal signature 212. The vibration signal signature 210 and the electrical signal signature 212 are used to determine a fault detection signal 216. The fault detection signal 216 may be representative of one or more diagnostic parameters. It should be noted herein that the terms "fault detection signal" and "diagnostic parameter" may be used interchangeably. In the illustrated embodiment, the fault detection signal 216 may be representative of various faults associated with the drivetrain 140, including but not limited to bearing faults, and gear faults of the drivetrain 140. In certain embodiments, the faults of the drivetrain 140 may include may include but not limited to high speed (HS) shaft gear fault, HS intermediate gear fault, planet gear fault, ring gear fault, sun gear fault, or the like. In some embodiments, additionally, the signal 216 may be indicative of bearing fault of the drivetrain 140 such as HS shaft bearing fault, high speed intermediate shaft (HSIS) fault, low speed intermediate shaft (LSIS) fault, planet bearing fault, or the like.

The faults of the drivetrain 140 generate two types of vibrations, namely torsional and radial vibrations. Vibration sensors 180 effectively sense radial vibrations compared to sensing torsional vibrations. Vibration analysis is a non-intrusive technique for monitoring the condition of mechanical components within rotating machines. For example, the condition of a particular component may be determined by considering the frequency and magnitude of vibration signals 202 generated by the particular component. Generally, components in good condition, for example, gears with complete sets of teeth, generate smaller amplitude vibrations than components in poor condition, for example, gears with chipped or missing teeth. The frequencies of vibrations generated by the gears are unique to the gear design and shaft rotation speed. One technique of vibration analysis involves analyzing frequency components of the vibration signal 202 measured from the drive train 140 and measuring the amplitude of the harmonic frequency components of the sideband of the vibration signal 202, and comparing with the amplitudes of adjacent harmonic frequencies.

The controller based device 190 employs a conditional monitoring system (CMS) to determine drivetrain faults based on the vibration signals. For example, a plurality of vibration sensors 180 may be located at predetermined locations on a gearbox casing. The controller based device 190 receives the signals 202 representative of the detected vibrations from the sensors 180. In one embodiment, the controller based device 190 performs a fast Fourier transform of the signals 202 representative of detected vibrations of gears and bearings and computes plurality of diagnostic parameters for determining the fault.

Electrical sensors 170, 171 are effective in monitoring electrical signals of the electrical machine having drivetrain faults due to torsional vibrations. Electrical signals 204, 206 are measured by the electrical sensors 170, 171 and are transmitted to the controller based device 190. As discussed herein, the electrical signal 204 is voltage signal and the electrical signal 206 is a current signal. Electrical signature analysis (ESA) of the electrical signals 204, 206 is performed by the controller based device 190 to generate one or more diagnostic parameters. Based on the diagnostic parameters, corresponding drivetrain faults are determined. In an embodiment of the present invention, a current signature analysis (CSA) is performed by the controller based device 190 to determine the drivetrain faults.

Figure 3:
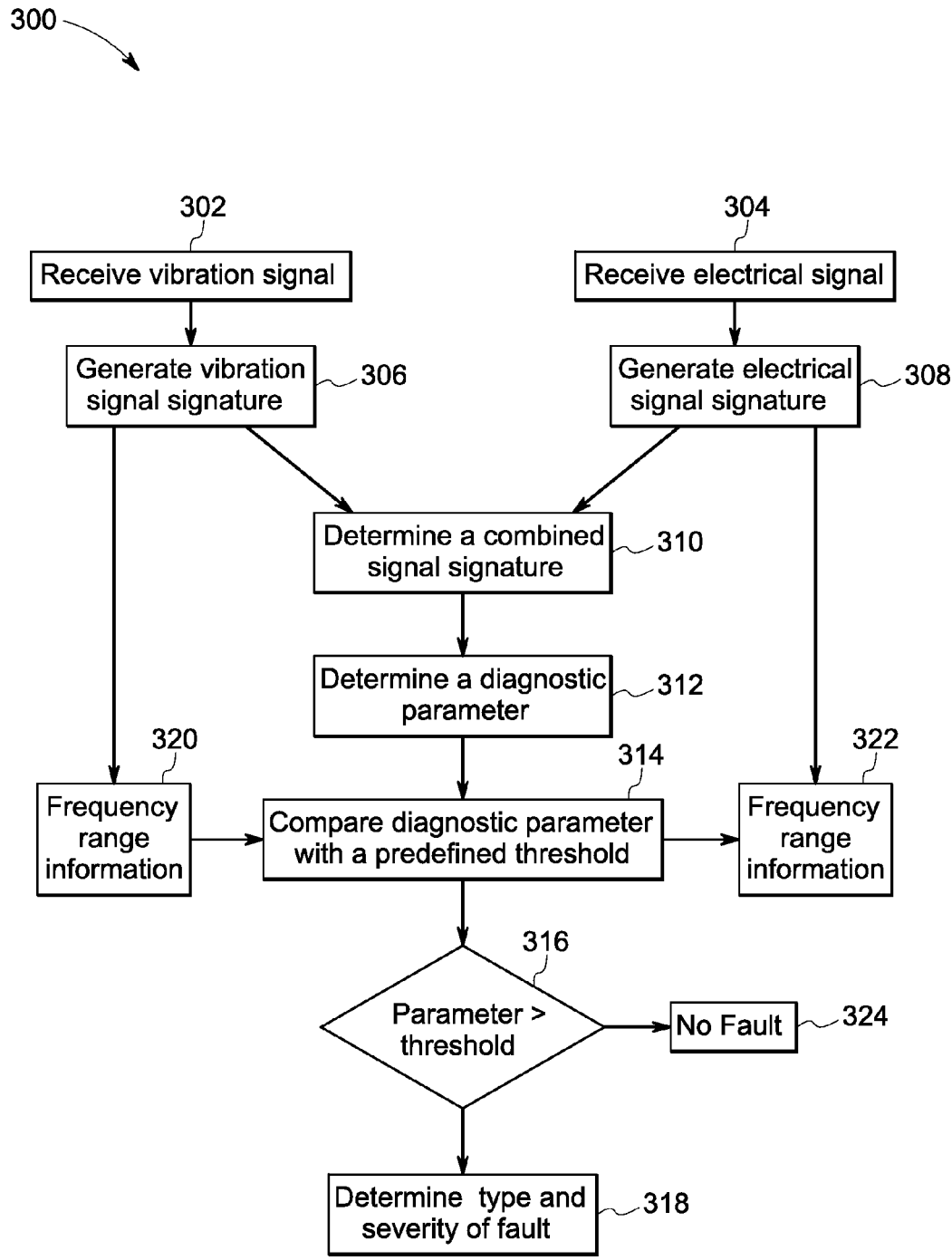
FIG. 3 is a flow chart illustrating exemplary steps involved in detection of drivetrain fault in accordance with an exemplary embodiment.

FIG. 3 is a flow chart 300 outlining an exemplary technique of fault detection in the mechanical device (e.g., drive train) in accordance with an exemplary embodiment. The controller based device receives vibration signal 302 and the electrical signals 304 and generates a vibration signal signature 306 and an electrical signal signature 308. The vibration signal is representative of at least one of a stator, bearing, gear, shaft vibrations of the drive train of the electromechanical device. The electrical signals may be representative of at least one of a measured voltage, and a measured current of the electrical device respectively. The vibration signal signature is determined by determining a spectrum of the vibration signal. Similarly, the electrical signal signature is determined by determining a spectrum of at least one of the electrical signals. The electrical signal signature and the vibration signal signature are representative of frequency spectrums of the electrical signals and the vibration signal respectively. In some embodiments, the frequency spectrum may be a Fourier transform, a discrete Fourier transform, a wavelet transform or any other transformation that is representative of frequency components of the signal signatures.

Figure 4A:
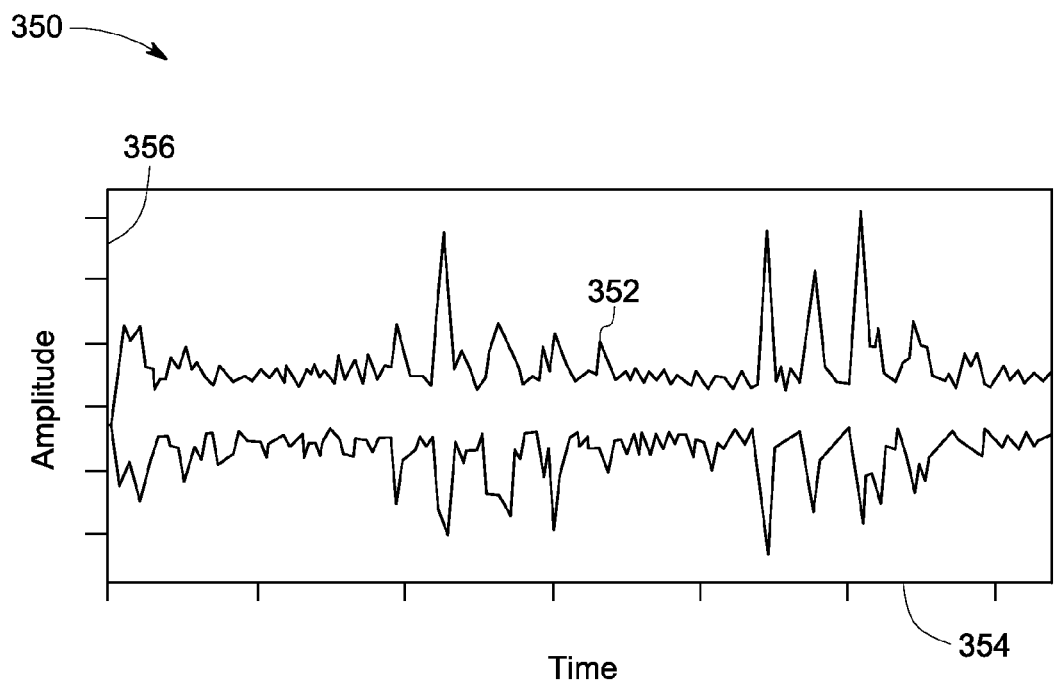
FIG. 4A is a graph of time domain electrical signal and FIG. 4B is a graph of corresponding frequency spectrum in accordance with an exemplary embodiment.

FIG. 4A is a graph 350 illustrating a curve 352 representative of a time domain signal, x-axis 354 representing time, and y-axis 356 representing amplitude of the signal curve 352. The time domain signal may be a vibration signal or an electrical signal.

Figure 4B:
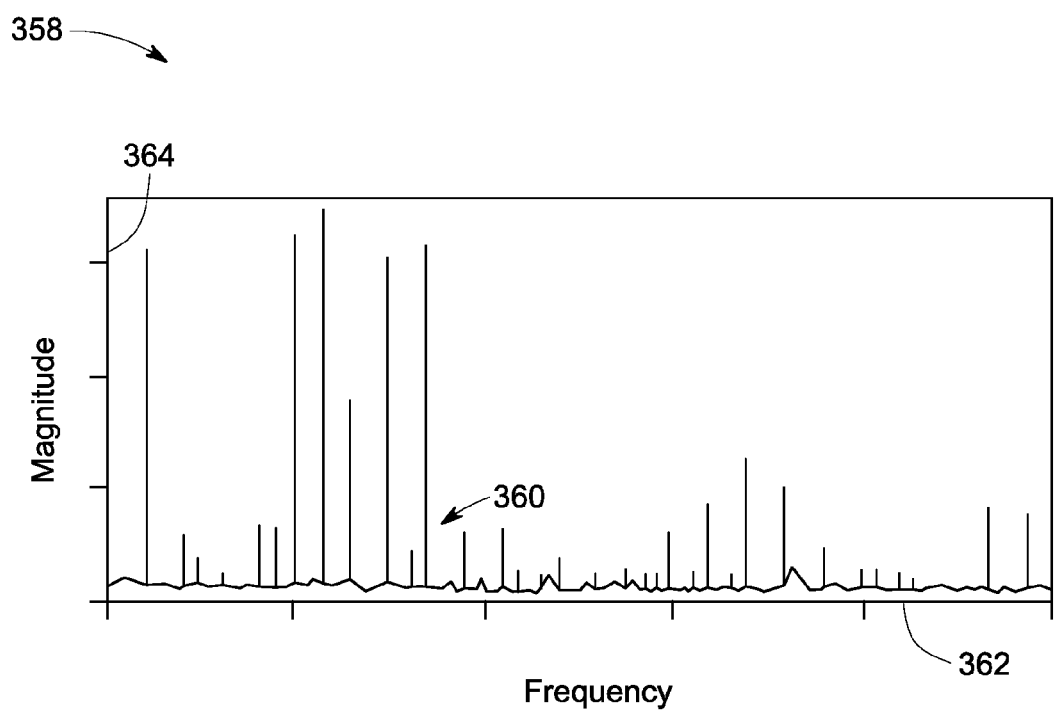

FIG. 4B illustrates a graph 358 illustrating a curve 360 representative of a spectrum of the signal 352 (shown in FIG. 4A). The curve 360 is a Fourier transform of the signal 352, x-axis 362 represents frequency and the y-axis 364 represents the magnitude of the spectrum.

Again referring back to FIG. 3, it should be noted herein that the electrical signal signature and the vibration signal signature may also be referred to as "a first signal signature" and "a second signal signature" respectively interchangeably. The method further includes deriving a third signal signature based on the electrical signal signature and the vibration signal signature 310. In one embodiment, a third signal signature may be a combination of the first and the second signal signatures. In one example, the first and the second signal signatures may be added to generate the third signal signature. In a specific embodiment, frequency of at least one of the first signal signature and the second signal signature may be modulated for generating the third signal signature.

A diagnostic parameter is determined based at least one of the first, second, and the third signal signatures 312. The diagnostic parameter is representative of a statistical property of the signal signature derived from at least one of the electrical signal signature, the vibration signal signature, and the combined signal signature (also referred to as "third signal signature"). For example, the diagnostic parameter may be an average value, or a peak value, or a median value, or a Root Mean Square (RMS) value of the electrical signal signature, the vibration signal signature and the combined signal signature. Suitable number of samples of any of the signal signatures may be used to determine the diagnostic parameter. The diagnostic parameter may also be determined as a statistical property within a particular frequency range corresponding to any of the signal signatures. For example, a signal signature in a particular frequency band is represented as, $$\underline{s(n)} = [s(n)s(n-1) \ldots s(n-k)], \quad (1)$$

where, $\underline{s(n)}$ is the signal, $s(n), s(n-1) \ldots s(n-k)$ are $k+1$ sample values of the signal signature. The average value as the diagnostic value of the signal signature $\underline{s(n)}$ is defined as:

$$Avg(\underline{s(n)}) = \frac{(s(n) + s(n-1) + \ldots + s(n-k))}{k+1}. \quad (2)$$

Similarly, as another example, the peak value as the diagnostic value of the signal signature $\underline{s(n)}$ is defined as:

$$Peak(\underline{s(n)}) = Max[s(n), s(n-1), \ldots s(n-k)]. \quad (3)$$

In yet another example, the root mean square (RMS) value as the diagnostic parameter of the electrical signal signature $s(n)$ is defined as:

$$RMS(\underline{s(n)}) = \frac{(s^2(n) + s^2(n-1) + \ldots + s(n-k))}{k+1}. \quad (4)$$

In certain embodiments, a plurality of diagnostic parameters are generated for determining types of the fault related to the drivetrain. Certain diagnostic parameters may be determined based on the electrical signal signature. Certain other diagnostic parameters may be determined based on the vibration signal signature. Further, certain other parameters may be determined based on the third signal signature. The diagnostic parameters may be determined based on the signal signatures, for frequency bands corresponding to various drivetrain faults under consideration. Frequency bands corresponding to drivetrain faults detected using vibration sensors are derived from the vibration signal signature 320. Similarly, frequency bands corresponding to drivetrain faults detected by electrical sensors are derived from the electrical signal signature 322. The frequency bands corresponding to various drivetrain faults are non-overlapping. It should be noted herein that the frequency band corresponding to a fault in a drivetrain component depends on the geometrical dimensions of the component, and operating parameters of the drivetrain. The operating parameters of the drivetrain may include, but not limited to, rotor speed, rotor excitation frequency, stator output frequency, load and shaft speed of the electromechanical device. The frequency range corresponding to the fault is also dependent on the vibrational signal model or the electrical signal model adopted in determining the fault.

In one embodiment, only the faults of the drivetrain which may not be determined based on the electrical signal signature are determined based on the vibration signal signature. Such an embodiment facilitates to reduce the number of vibration sensors required for determining faults. In another embodiment, certain faults are determined using based on electrical signal signature and the vibration signal signature independently. Reliability of fault detection may be enhanced by combining the decisions derived based on two methods independently.

In one embodiment, a frequency transformation signal $A(f)$ is determined as the second signal signature 308 based on the measured vibration signal. Based on the signal signature $A(f)$, four diagnostic parameters are determined as:

$$D_{v1} = \frac{1}{P} \sum_{i=Low1}^{High1} A^2(f_i) \quad (5)$$

$$D_{v2} = \frac{1}{P} \sum_{i=Low2}^{High2} A^2(f_i) \quad (6)$$

$$D_{v3} = \frac{1}{P} \sum_{i=Low3}^{High3} A^2(f_i), \quad (7)$$

$$D_{v4} = \frac{1}{P} \sum_{i=Low4}^{High4} A^2(f_i) \quad (8)$$

where $D_{v1}$, $D_{v2}$, $D_{v3}$, and $D_{v4}$ are diagnosing parameters corresponding to a planetary gear, an intermediate gear, a high speed gear and bearings respectively. $A(f_i)$ is the amplitude of the vibration signal signature at frequency "i", "P" is a normalizing constant corresponding to the energy of the vibration signal signature. Frequency ranges used to determine the four diagnostic parameters $D_{v1}$, $D_{v2}$, $D_{v3}$, and $D_{v4}$ are denoted by [Low1, High1] [Low2, High2] [Low3, High3], and [Low4, High4] respectively. In one embodiment, for example, Low1 corresponds to a frequency of 20 Hz and High1 corresponds to a frequency of 130 Hz, Low2 corresponds to a frequency of 140 Hz and High2 corresponds to a frequency of 550 Hz, Low3 corresponds to a frequency of 560 Hz and High3 corresponds to a frequency of 3 KHz, and finally, Low4 corresponds to a frequency of 4 kHz and High4 corresponds to the highest frequency of the vibration signal signature.

To determine a fault in high speed gear, the amplitude of the vibration signal $A(fi)$ in the frequency range 560 Hz to 3000 Hz is compared with a pre-defined threshold. If the value of the amplitude of the vibration signal is greater than the threshold value, a high speed gear fault is detected. If the value of the amplitude of the vibration signal is less or equal to the threshold value, it indicates that the high speed gear is in a "healthy condition". The method of setting the value of the predefined threshold is discussed in a subsequent paragraph.

In another embodiment, a Fourier transform representation of the measured electrical signal is determined. The frequency of the electrical signal signature corresponding to the bearing fault of the drivetrain $f_{bearing}$ is determined as follows:

$$f_{bearing}: \begin{cases} \text{Outer.raceway} \ldots f_{orw} = \frac{N_b}{2} f_r \left(1 - \frac{D_b}{D_c} \cos\beta\right) & (9) \\ \text{Inner.raceway} \ldots f_{irw} = \frac{N_b}{2} f_r \left(1 + \frac{D_b}{D_c} \cos\beta\right) \\ \text{Ball} \ldots f_{ball} = \frac{D_c}{D_b} f_r \left(1 - \frac{D_b^2}{D_c^2} \cos^2\beta\right) \end{cases}$$

where $f_{orw}$ is the frequency corresponding to outer raceway fault, $f_{irw}$ is the frequency corresponding to inner raceway fault, and $f_{ball}$ is the frequency corresponding to ball damage. $N_b$ is the number of balls in the bearing, $D_b$, $D_c$, and $\beta$ are the dimensional parameters of the bearing, $f_r$ is the stator current frequency corresponding to rotor speed. The stator current frequency corresponding to the bearing fault is represented by:

$$f_s = f_{fundamental} \pm k \cdot f_{bearing} | \qquad (10)$$

Where, $f_s$ is the stator current frequency, $f_{fundamental}$ is the stator output frequency, k is a constant corresponding to different failure modes.

In a specific embodiment, the frequency corresponding to an outer race fault of the intermediate gear is determined based on the physical and operational parameters of the drivetrain. The bearing frequency is computed from equation (9) as:

$$f_{bearing} = \frac{N_b}{2} (f_{shaftspeed} \div f_{excitation}) \times \text{Gear\_ratio} \times \left(1 - \frac{D_b}{D_c} \cos\beta\right)$$

where $f_{shaftspeed}$ is the rotational speed of the shaft, $f_{fundamental}$ is the fundamental frequency of 60 Hz, Gear_ratio is the teeth ratio corresponding to the intermediate gear. The bearing frequency is the frequency corresponding to the outer race fault $f_{orw}$. The stator current frequency corresponding to outer race fault of the bearing of the drive train, is calculated according to equation (10) as:

$$f_s = f_{fundamental} \pm k \cdot f_{orw})$$

The amplitude of the electrical signal signature at a frequency fs is representative of information about the outer race fault of the intermediate gear of the drivetrain. A peak amplitude of the electrical signal signature is representative of the diagnostic parameter corresponding to the outer race fault of the bearing of the drivetrain. The diagnostic parameter is compared with a predefined threshold 314. If the diagnostic parameter is greater than the predefined threshold 316, then the outer race fault of the bearing is determined 318. If the diagnostic parameter is less than the predefined threshold, then the bearing of the drivetrain do not have an outer race fault 324.

The method further includes determining fault severity of each of the determined drivetrain fault. For example, each of the drivetrain faults may be classified as mild, medium or high severity. To determine the severity of a particular fault, the diagnostic parameter corresponding to the drivetrain fault is compared with two thresholds. If the diagnostic parameter is less than both the thresholds, the fault is considered as of low severity. If the diagnostic parameter is in between the two thresholds, the fault is considered as of medium severity. If the diagnostic parameter is greater than both the thresholds, the fault is considered as of high severity.

The threshold values discussed herein are determined apriori based on baseline measurements from a faultless drivetrain. In one embodiment, the signal signatures are determined for an electromechanical device operating under normal conditions without any faults. A peak value of the signal signature in a suitable frequency band corresponding to a drivetrain fault is determined. This value is used to define a pre-defined threshold corresponding to the drivetrain fault. To improve the fault detection accuracy, a set of thresholds are determined apriori for each component of the drivetrain, including gearbox and bearing of the electromechanical device assembly. A plurality of current and voltage signals for baseline conditions and fault detection conditions are measured for each component and corresponding threshold values are set. For example, to differentiate a deteriorated gearbox condition from other faulty components, a warning threshold value for the Root Mean Square (RMS) value of the stator current spectrum of the gearbox is determined. A possible gearbox fault may be detected if there is a variation between the stator current spectrum and the determined warning threshold value. To avoid misjudgment due to insufficient data, the controller based device measures a plurality of samples of the stator current, for example, around 30-50 samples of measurement values. When the RMS value of the stator current value exceeds the pre-defined threshold value, a drivetrain fault condition in the gearbox is determined. Similarly, corresponding to each type of the drivetrain fault, one or more additional threshold values are determined to identify severity of the fault.

Figure 5:
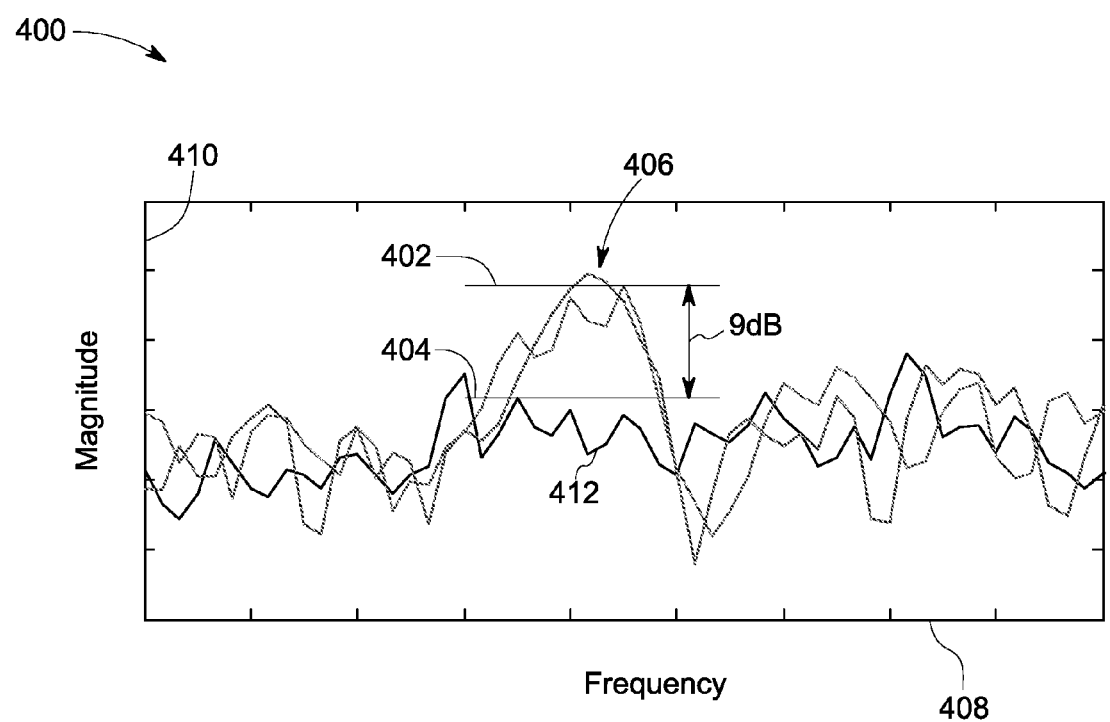
FIG. 5 is a graphical representation of a stator current in the frequency domain of a damaged gearbox with having an outer race bearing fault in accordance with an exemplary embodiment.

FIG. 5 is a graphical representation 400 of a sample stator current in the frequency domain of a damaged gearbox having an outer race bearing fault. The x-axis 408 represents frequency in Hz (Hertz) and the y-axis 410 represents amplitude in dB (Decibel) of the stator current spectrum. Curve 412 represents a spectrum of a stator current during a healthy gearbox condition while curve 406 represents a spectrum of a stator current during a faulty gearbox condition having an outer race bearing fault. The spectrum peak 402 of the curve 406 representative of the stator current due to the gearbox fault is higher compared to the spectrum peak 404 of the curve 412 representative of the stator current of the healthy gearbox. In the illustrated embodiment, the difference between the spectrum peaks 404, 402 representative of a healthy gearbox condition and a faulty gearbox condition is about 9 dB.

In accordance with the embodiments discussed herein, faults in a drivetrain of an electromechanical device are determined by using one or more electrical signals measured from one or more electric sensors and one or more vibration signals measured from one or more vibration sensors. Electrical signal signatures are derived from the electrical signals and vibration signal signatures are derived from the vibration signals. Based on the electrical signal signatures and the vibration signal signatures, various drivetrain faults are determined. Use of electrical signals, facilitates to reduce the number of vibration signals in determining the drivetrain faults.

It is to be understood that not necessarily all such objects or advantages described above may be achieved in accordance with any particular embodiment. Thus, for example, those skilled in the art will recognize that the systems and techniques described herein may be embodied or carried out in a manner that achieves or improves one advantage or group of advantages as taught herein without necessarily achieving other objects or advantages as may be taught or suggested herein.

While the technology has been described in detail in connection with only a limited number of embodiments, it should be readily understood that the invention is not limited to such disclosed embodiments. Rather, the technology can be modified to incorporate any number of variations, alterations, substitutions or equivalent arrangements not heretofore described, but which are commensurate with the spirit and scope of the claims. Additionally, while various embodiments of the technology have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A system, comprising:
   a controller based device configured to:
      receive measured electrical signals from an electrical device of an electromechanical device, wherein the electrical signals are representative of a measured current and a measured voltage of the electrical device;
      receive a measured vibration signal from a mechanical device of the electromechanical device, coupled to the electrical device, wherein the mechanical device comprises a drive train;
      determine a first signal signature based on the measured electrical signal by determining a spectrum of the electrical signal, wherein the spectrum may comprise a Fourier transform, a discrete Fourier transform, or a wavelet transform;
      determine a second signal signature based on the measured vibration signal by performing a fast Fourier transform of the measured vibration signal;
      determine a third signal signature based on the first signal signature and the second signal signature
      determine a diagnostic parameter based on the first signal signature and the second signal signature, wherein the controller based device is further configured to determine the diagnostic parameter based on the third signal signature by computing at least one of an average value, a peak value, a median value of at least one of the first signal signature, the second signal signature and the third signal signature; and
      determine a fault of the mechanical device based on the diagnostic parameter.

2. The system of claim 1, wherein the controller based device is configured to determine the second signal signature by determining a spectrum of the vibration signal.

3. The system of claim 1, wherein the controller based device is configured to determine the fault of the mechanical device by comparing the diagnostic parameter with a predefined threshold value.

4. A non-transitory computer readable medium encoded with a program to instruct a controller based device to:
   receive measured electrical signals from an electrical device of an electromechanical device, wherein the electrical signals are representative of a measured current and a measured voltage of the electrical device;
   receive a measured vibration signal from a mechanical device of the electromechanical device, coupled to the electrical device, wherein the mechanical device comprises a drive train;
   determine a first signal signature based on the measured electrical signal by determining a spectrum of the electrical signal, wherein the spectrum may comprise a Fourier transform, a discrete Fourier transform or a wavelet transform;
   determine a second signal signature based on the measured vibration signal performing a fast Fourier transform of the measured vibration signal;
   determine a third signal signature based on the first signal signature and the second signal signature
   determine a diagnostic parameter based on the first signal signature and the second signal signature, wherein the controller based device is further configured to determine the diagnostic parameter based on the third signal signature by computing at least one of an average value, a peak value, a median value of at least one of the first signal signature, the second signal signature and the third signal signature; and
   determine a fault of the mechanical device based on the diagnostic parameter.

5. The system of claim 1, wherein the controller based device is configured to add the first signal signature and the second signal signature to generate the third signal signature.

6. The system of claim 1, wherein the controller based device is configured to modulate a frequency of the first signal signature and a frequency of the second signal signature to generate the third signal signature.

7. The system of claim 3, wherein the controller based device is configured to determine a severity of the fault of the mechanical device by comparing the diagnostic parameter with two predefined threshold values.

8. The non-transitory computer readable medium of claim 4, wherein the program instructs the controller based device to determine the second signal signature by determining a spectrum of the vibration signal.

9. The non-transitory computer readable medium of claim 1, wherein the program instructs the controller based device to determine the fault of the mechanical device by comparing the diagnostic parameter with a predefined threshold value.

10. The non-transitory computer readable medium of claim 4, wherein program instructs the controller based device to add the first signal signature and the second signal signature to generate the third signal signature.

11. The non-transitory computer readable medium of claim 4, wherein the program instructs the controller based device to modulate a frequency of the first signal signature and a frequency of the second signal signature to generate the third signal signature.

12. The non-transitory computer readable medium of claim 9, wherein the program instructs the controller based device to determine a severity of the fault of the mechanical device by comparing the diagnostic parameter with two predefined threshold values.

13. The system of claim 1, wherein the first signal signature is a Fourier transform of the measured electrical signals and a frequency $f_{bearing}$ of the first signal signature corresponds to a bearing fault a bearing of the drivetrain and is determined as $$f_{bearing}: \begin{array}{l} \text{Outer.raceway} \ldots f_{orw} = \dfrac{N_b}{2} f_r \left(1 - \dfrac{D_b}{D_c}\cos\beta\right) \\[6pt] \text{Inner.raceway} \ldots f_{irw} = \dfrac{N_b}{2} f_r \left(1 + \dfrac{D_b}{D_c}\cos\beta\right) \\[6pt] \text{Ball.} \ldots f_{ball} = \dfrac{D_c}{D_b} f_r \left(1 - \dfrac{D_b^2}{D_c^2}\cos^2\beta\right) \end{array}$$

where $f_{Orw}$ is a frequency corresponding to an outer raceway fault, $f_{irw}$ is a frequency corresponding to an inner raceway fault, and $f_{ball}$ is a frequency corresponding to ball damage; $N_b$ is a number of balls in the bearing, $D_b$, $D_c$, and $\beta$ are the dimensional parameters of the bearing, and $f_r$ is a stator current frequency of the electrical device corresponding to a rotor speed of the electrical device.

14. The system of claim 13, wherein the stator current frequency corresponding to the bearing fault is $$f_s = |f_{fundamental} \pm k \cdot f_{bearing}|,$$

wherein $f_s$ is the stator current frequency, $f_{fundamental}$ is the stator output frequency, k is a constant corresponding to different failure modes.

15. The non-transitory computer readable medium of claim 4, wherein the first signal signature is a Fourier transform of the measured electrical signals and a frequency $f_{bearing}$ of the first signal signature corresponds to a bearing fault a bearing of the drivetrain and is determined as $$f_{bearing}: \begin{array}{l} \text{Outer.raceway} \ldots f_{orw} = \dfrac{N_b}{2} f_r \left(1 - \dfrac{D_b}{D_c}\cos\beta\right) \\[6pt] \text{Inner.raceway} \ldots f_{irw} = \dfrac{N_b}{2} f_r \left(1 + \dfrac{D_b}{D_c}\cos\beta\right) \\[6pt] \text{Ball} \ldots f_{ball} = \dfrac{D_c}{D_b} f_r \left(1 - \dfrac{D_b^2}{D_c^2}\cos^2\beta\right) \end{array}$$

where $f_{Orw}$ is a frequency corresponding to an outer raceway fault, $f_{irw}$ is a frequency corresponding to an inner raceway fault, and $f_{ball}$ is a frequency corresponding to ball damage; $N_b$ is a number of balls in the bearing, $D_b$, $D_c$, and $\beta$ are the dimensional parameters of the bearing, and $f_r$ is a stator current frequency of the electrical device corresponding to a rotor speed of the electrical device.

16. The non-transitory computer readable medium of claim 15, wherein the stator current frequency corresponding to the bearing fault is $$f_s = |f_{fundamental} \pm k \cdot f_{bearing}|,$$

wherein $f_s$ is the stator current frequency, $f_{fundamental}$ is the stator output frequency, k is a constant corresponding to different failure modes.

\* \* \* \* \*